US008652966B2

(12) United States Patent
Furuya

(10) Patent No.: US 8,652,966 B2
(45) Date of Patent: Feb. 18, 2014

(54) SEMICONDUCTOR DEVICE MANUFACTURING METHOD AND SEMICONDUCTOR DEVICE

(75) Inventor: Akira Furuya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/398,363

(22) Filed: Feb. 16, 2012

(65) Prior Publication Data
US 2012/0235302 A1 Sep. 20, 2012

(30) Foreign Application Priority Data

Mar. 17, 2011 (JP) ................. 2011-059216

(51) Int. Cl.
*H01L 21/44* (2006.01)
(52) U.S. Cl.
USPC ........... 438/677; 438/637; 438/639; 438/672; 438/675; 257/E21.584; 257/E21.585; 257/E21.586
(58) Field of Classification Search
None
See application file for complete search history.

(56) References Cited

U.S. PATENT DOCUMENTS

| 2003/0134510 A1* | 7/2003 | Lee et al. ....................... 438/674 |
| 2009/0179332 A1* | 7/2009 | Ono ............................... 257/758 |

FOREIGN PATENT DOCUMENTS

JP 2010-080525 4/2010

OTHER PUBLICATIONS

Jon Reid and Jian Zhou, "Electrofill Challenges and Directions for Future Device Generations", Advanced Metallization Conference 2007 Japan/Asia Session, pp. 26-27.

* cited by examiner

*Primary Examiner* — Julio J Maldonado
*Assistant Examiner* — Joseph Galvin, III
(74) *Attorney, Agent, or Firm* — Young & Thompson

(57) ABSTRACT

A semiconductor manufacturing method includes: forming a seed film including a first metal over a bottom surface and a side wall of an opening portion formed over interlayer insulating films and a field portion located over the interlayer insulating film except the opening portion, forming a resist over the seed film and filling the opening portion with the resist, removing part of the resist, exposing the seed film formed over the upper portion of the side walls of the opening portion and the field portion, forming a cover film including a second metal, whose resistivity is higher than that of the first metal, over the seed film located over the upper portion of the side wall of the opening portion and the field portion, exposing the seed film by removing the resist, and forming a plating film including the first metal over the exposed seed film.

10 Claims, 21 Drawing Sheets

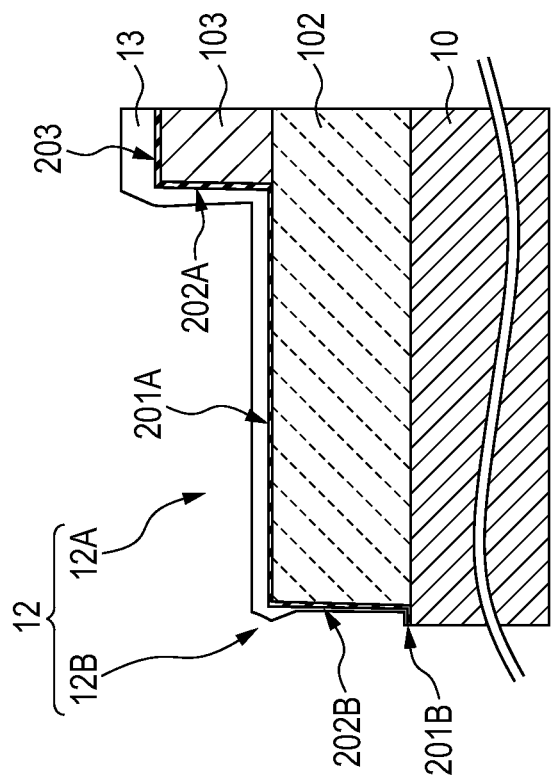
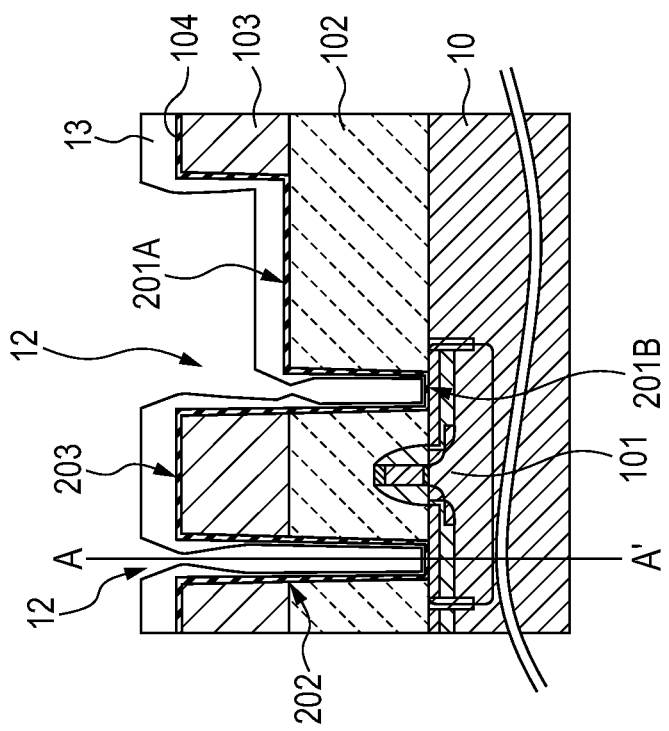
FIG. 1A
FIG. 1B

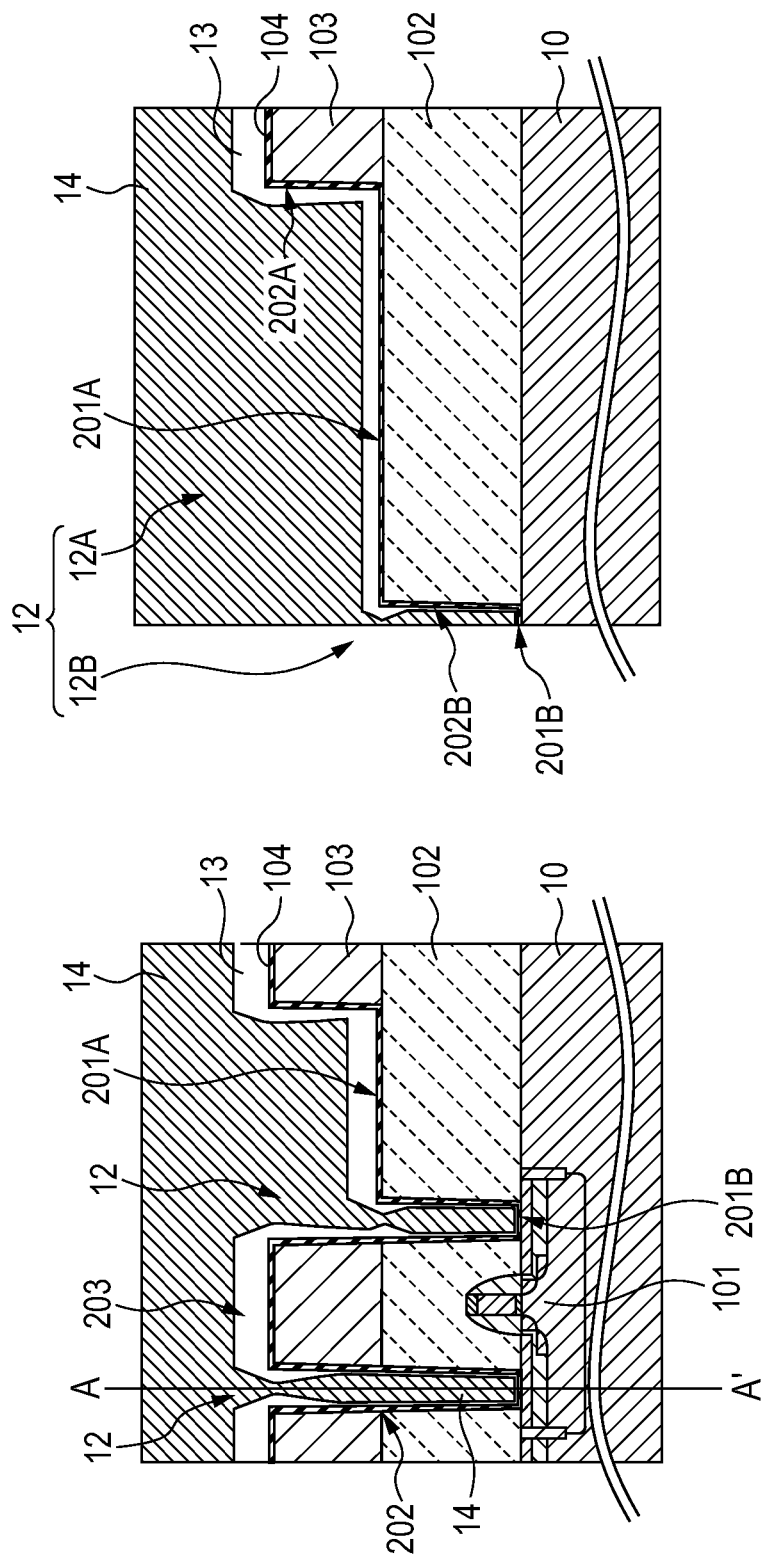

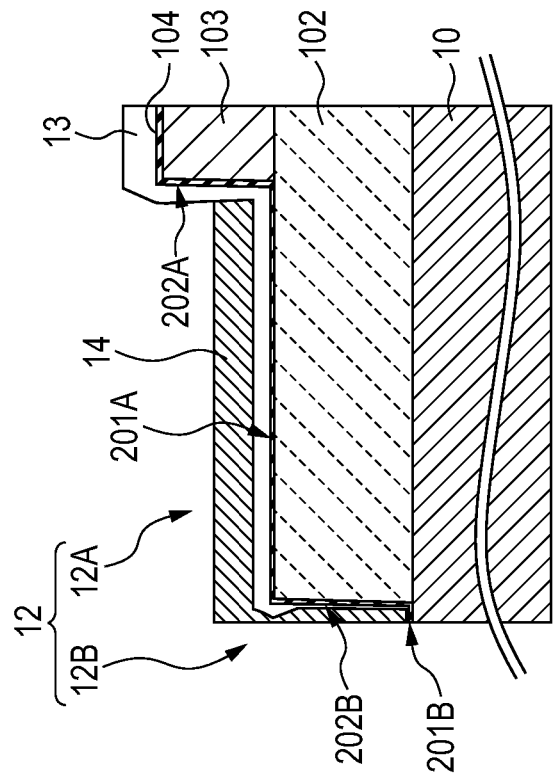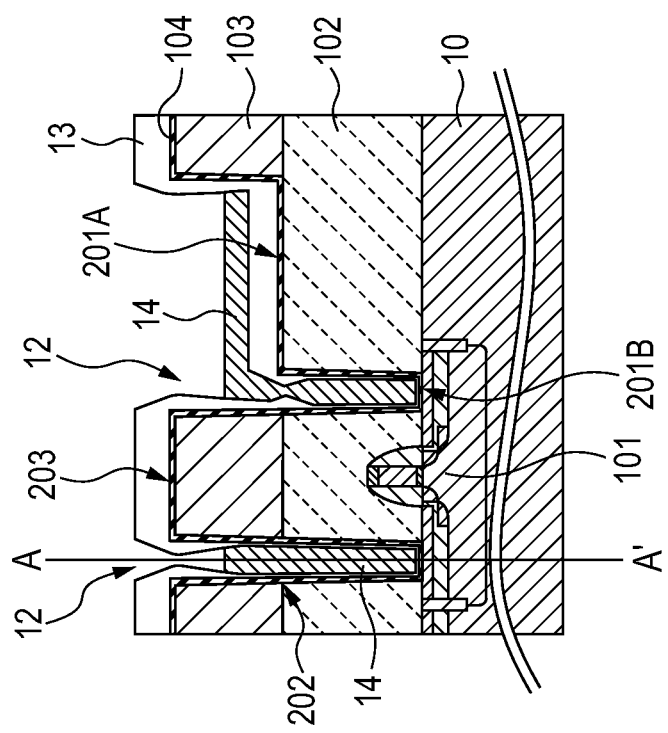
FIG. 3A
FIG. 3B

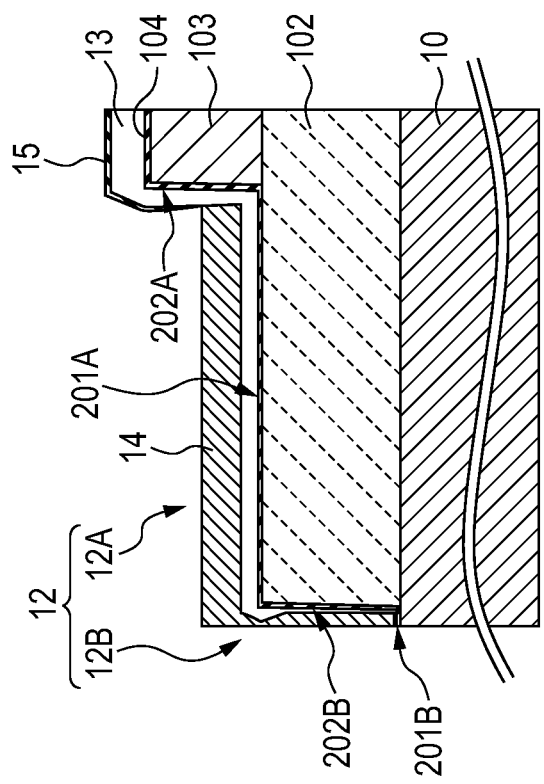
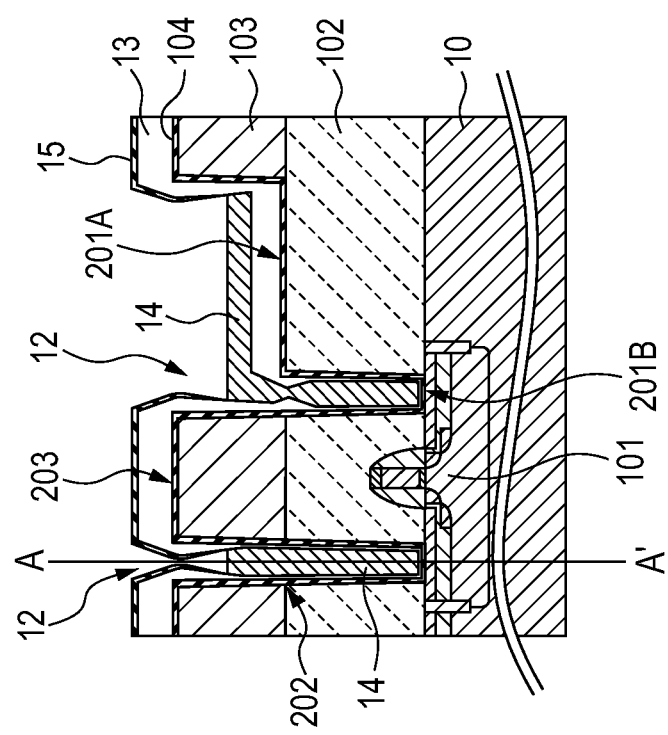
FIG. 4A
FIG. 4B

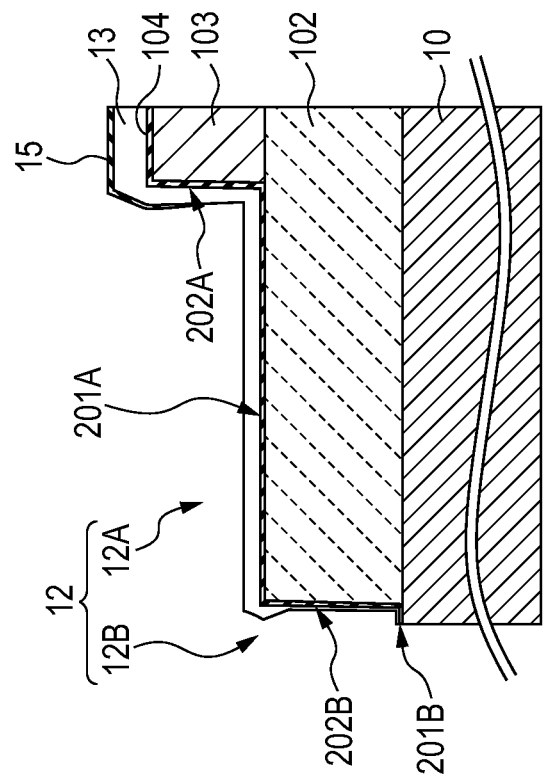
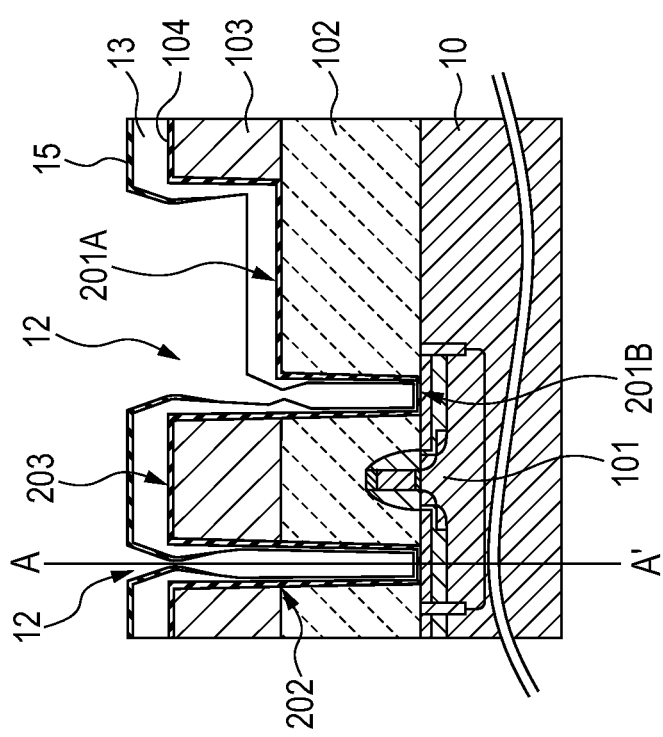

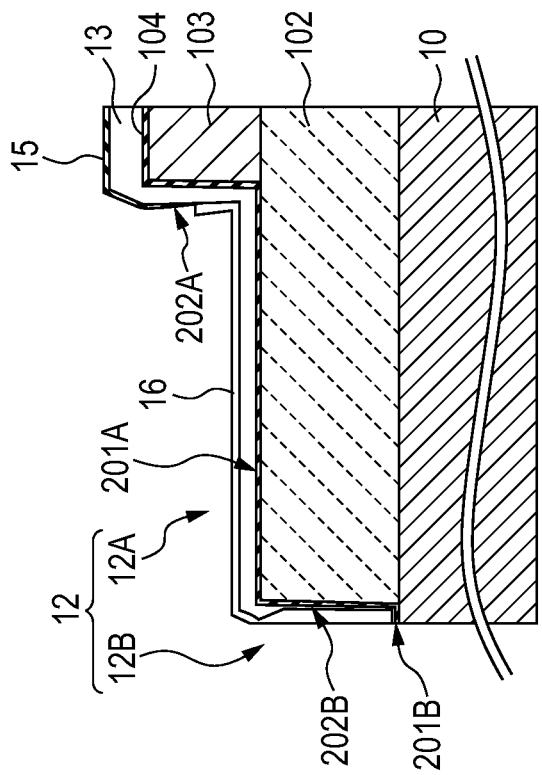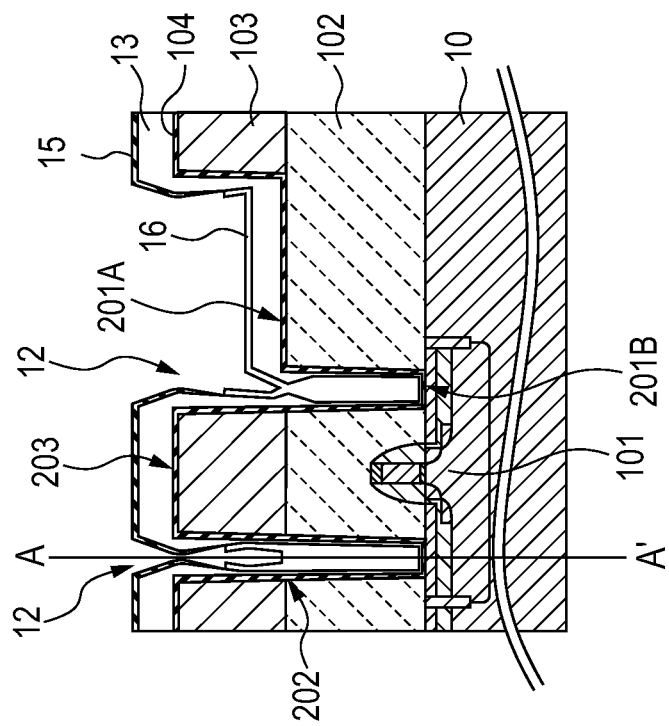

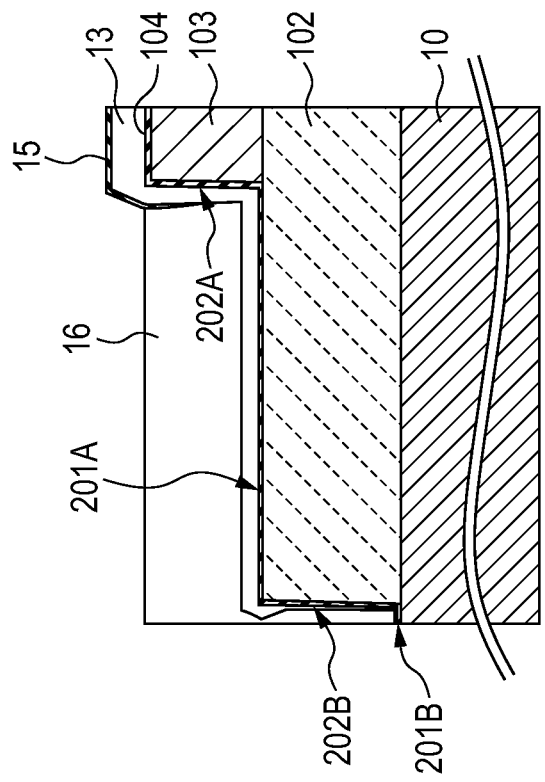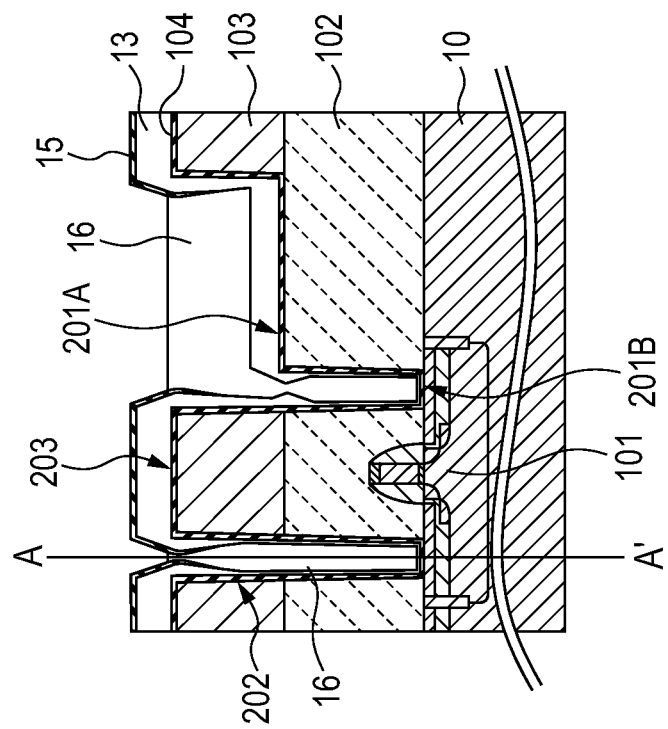
FIG. 7A
FIG. 7B

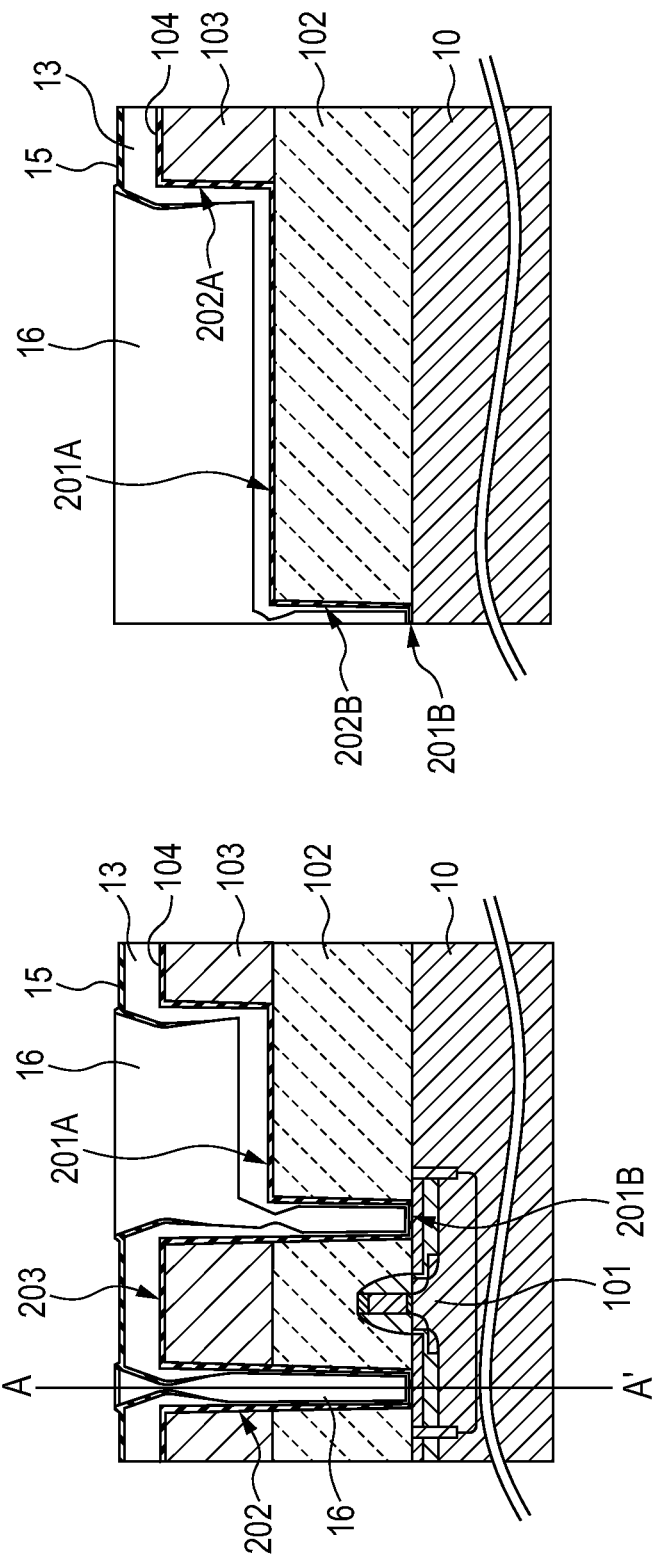

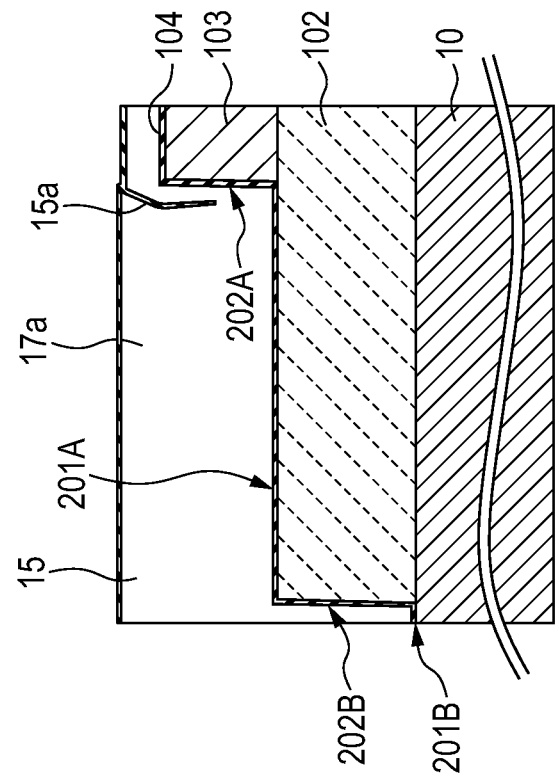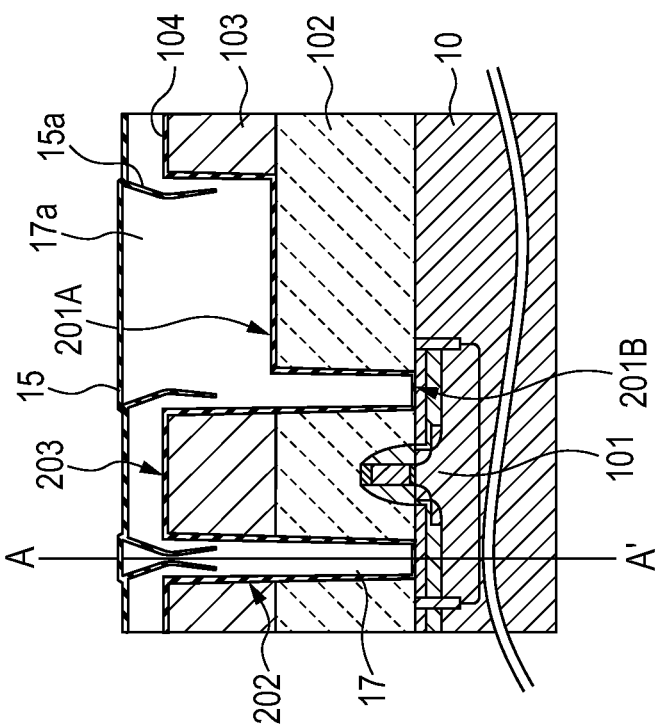

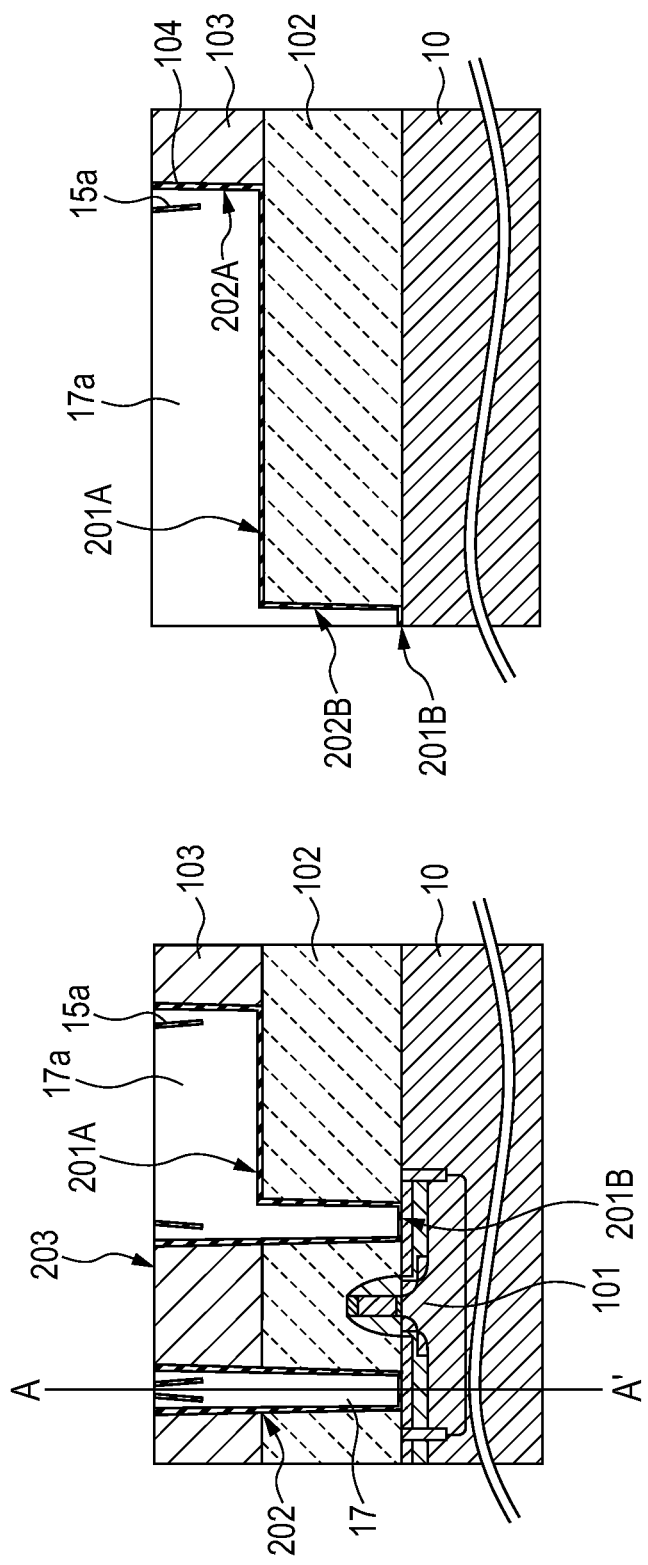

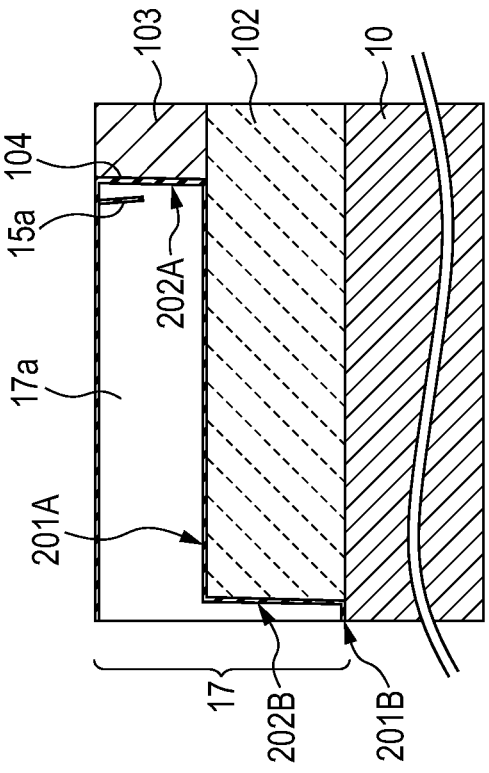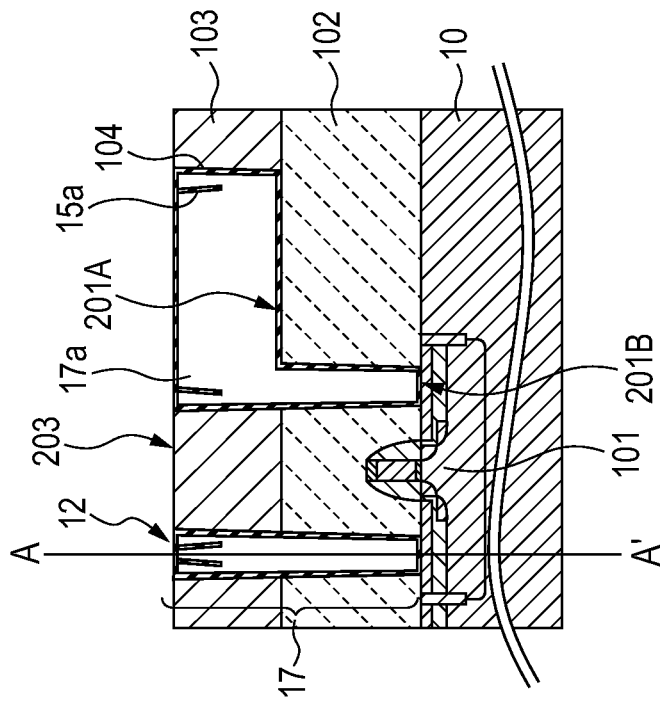
FIG. 11A
FIG. 11B

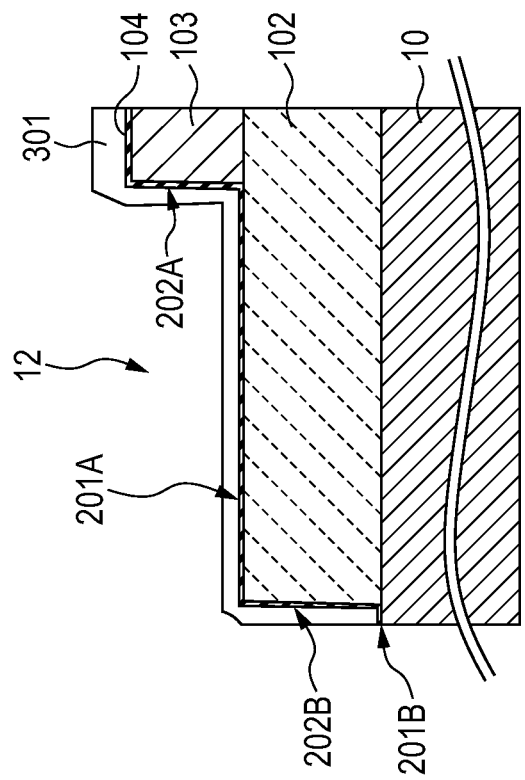
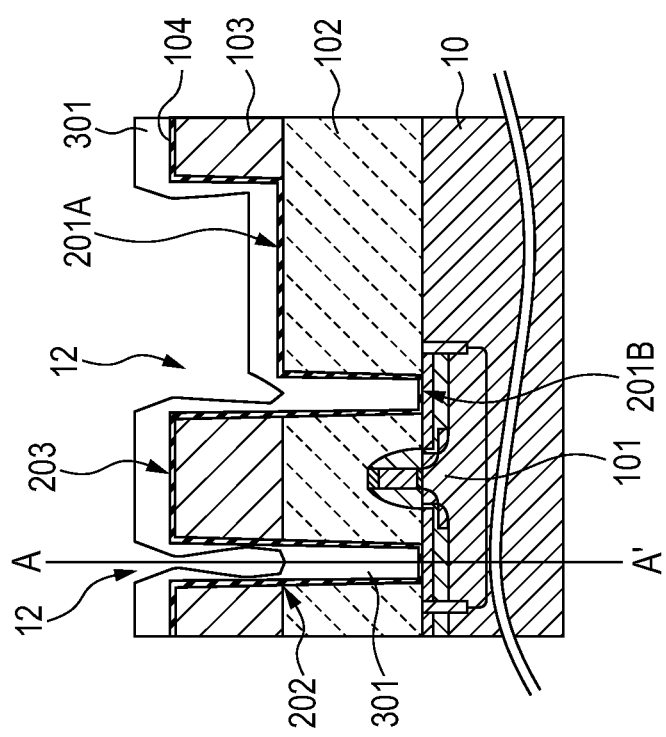

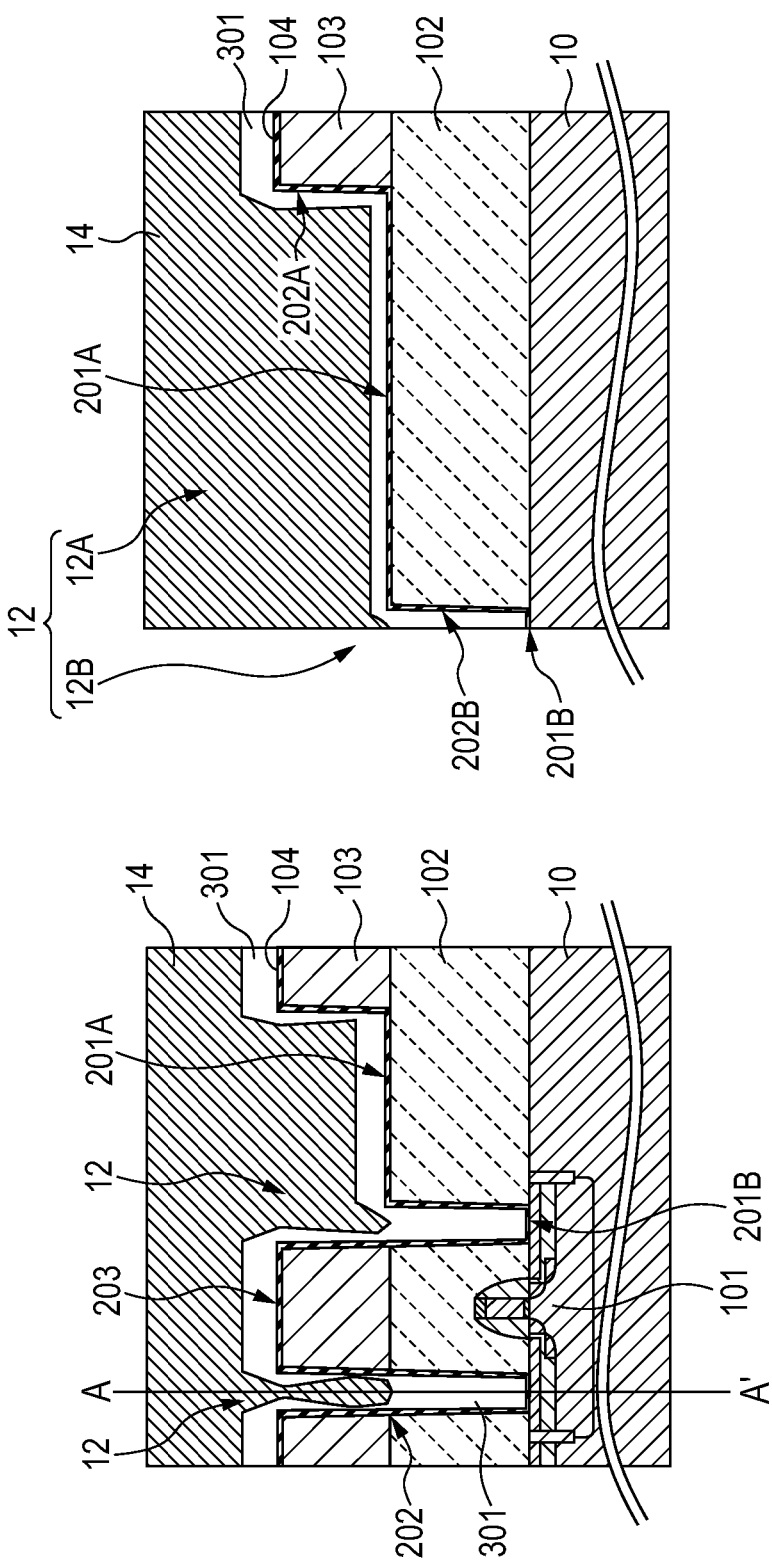

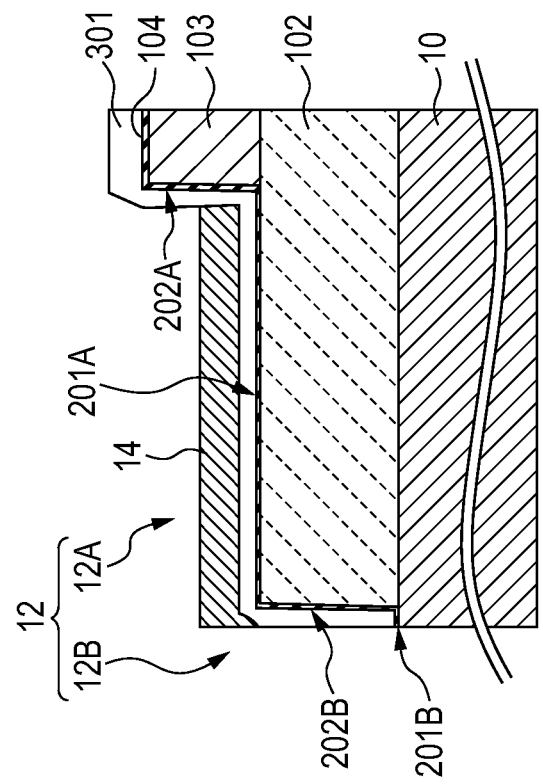
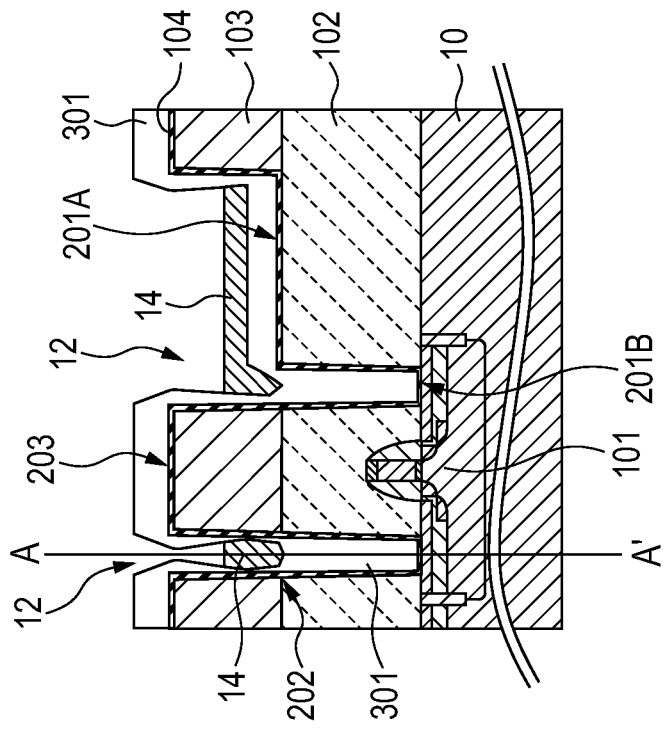

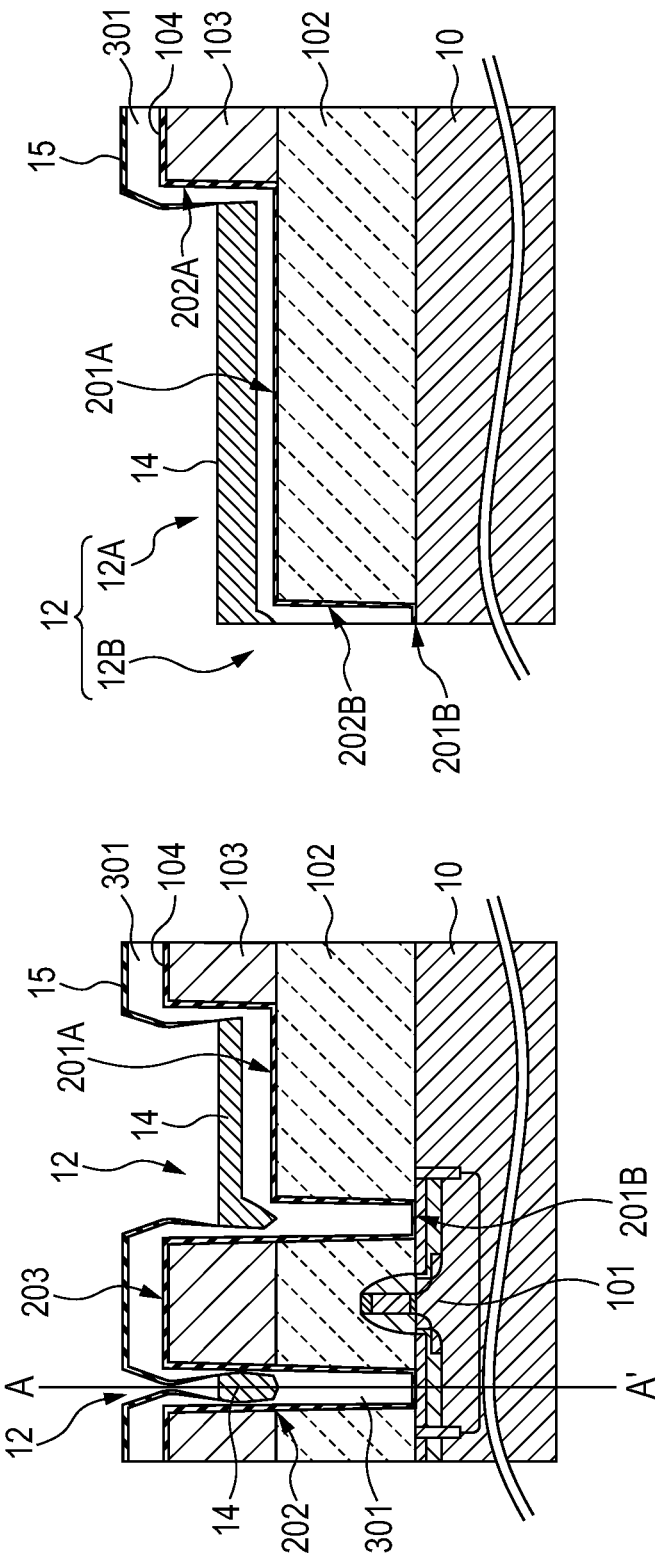

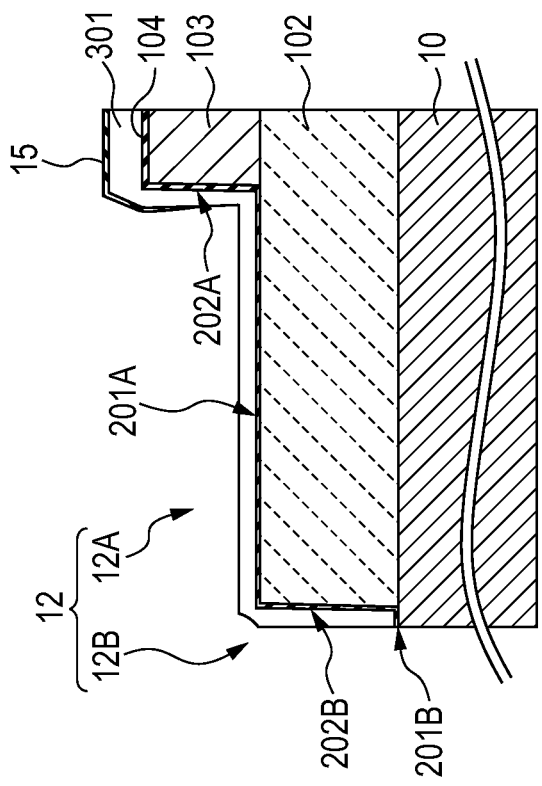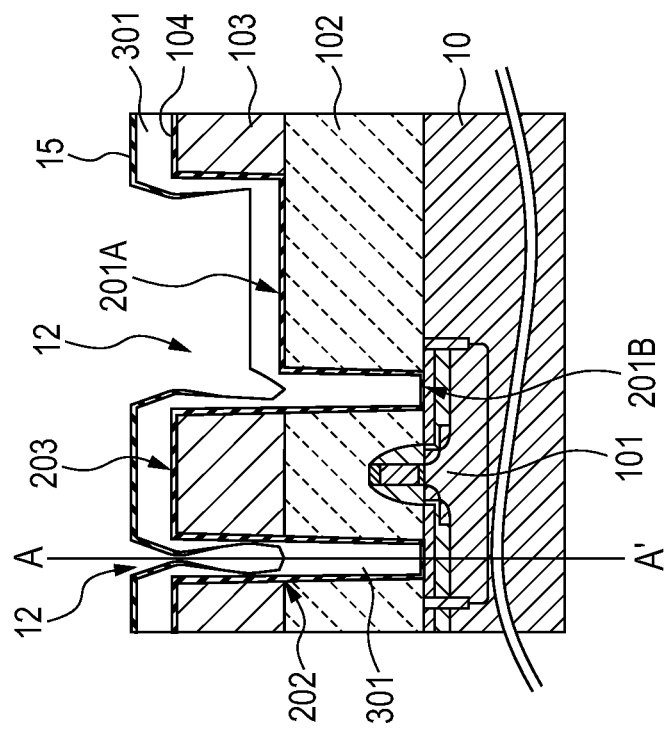
FIG. 16A
FIG. 16B

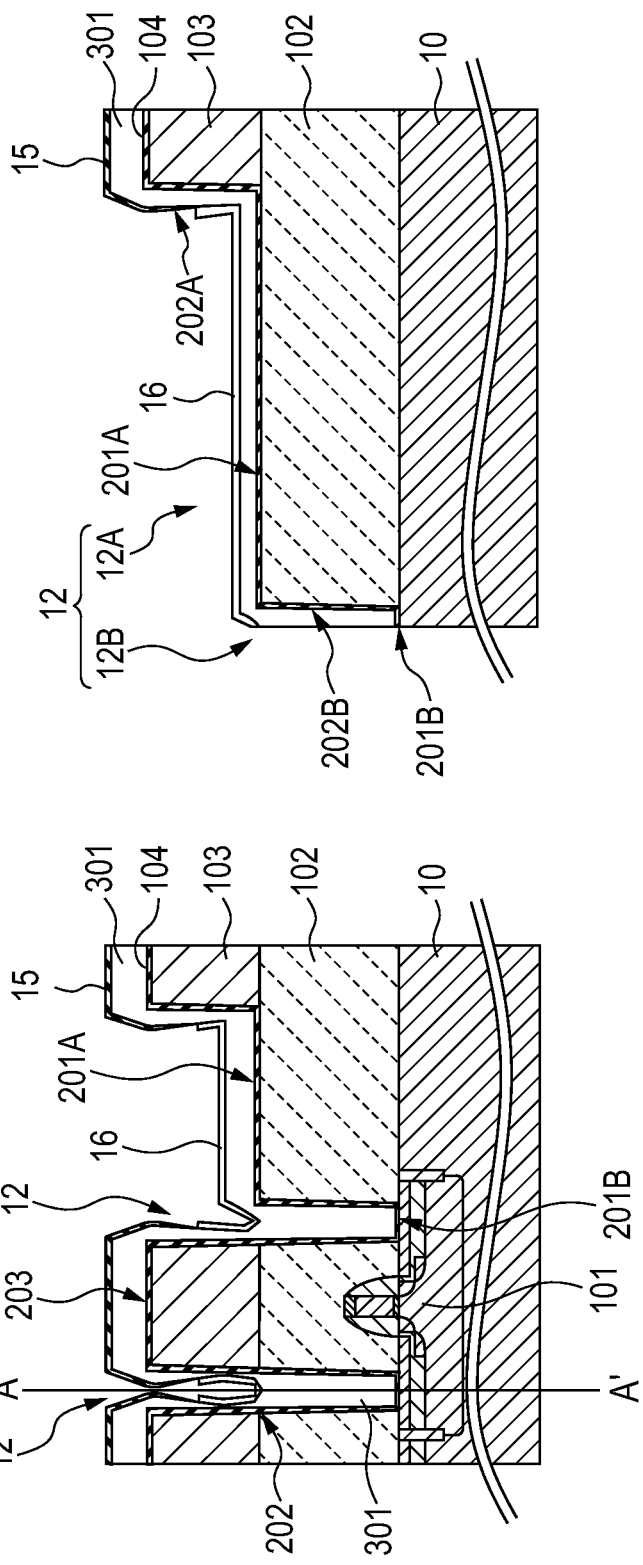

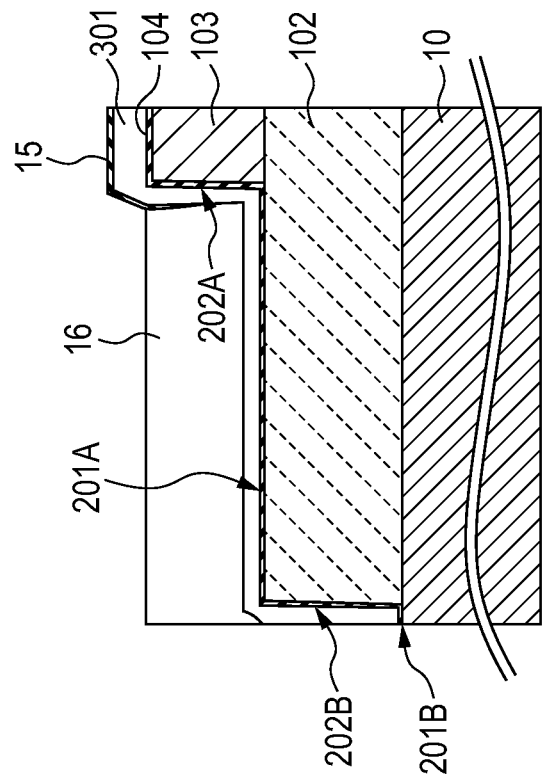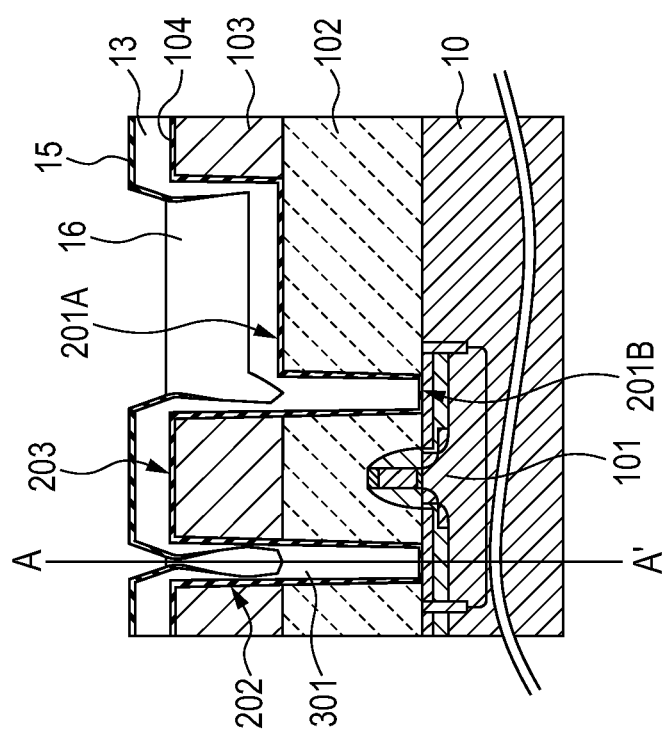

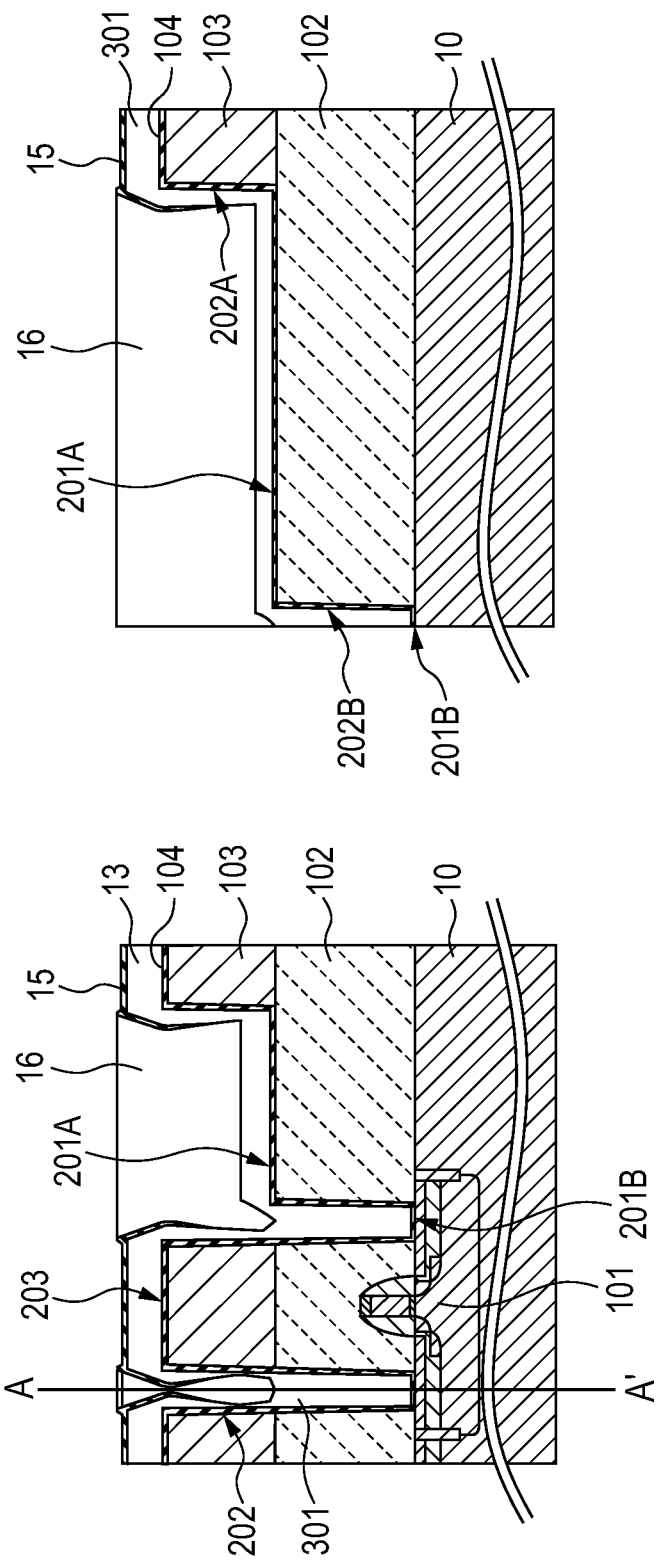

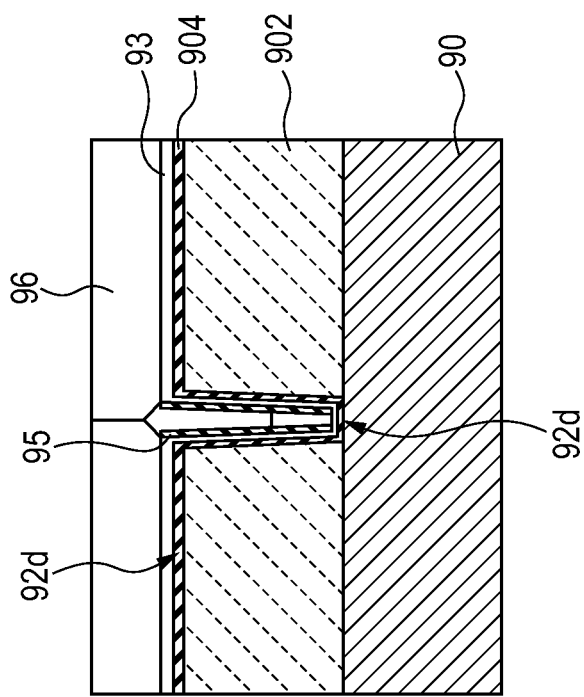
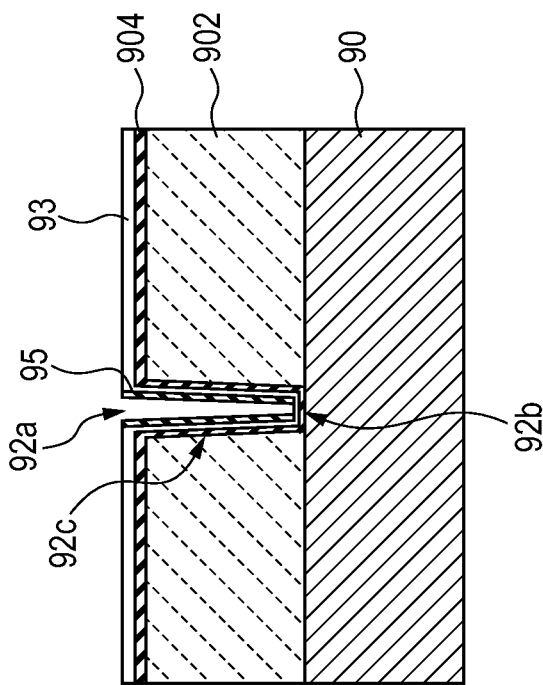
FIG. 20A
FIG. 20B

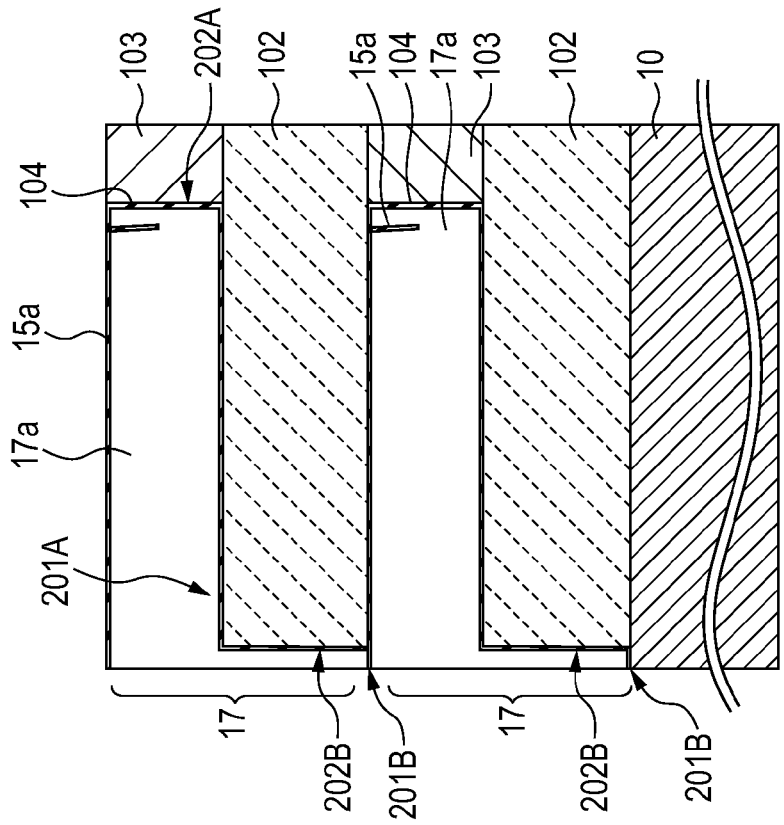
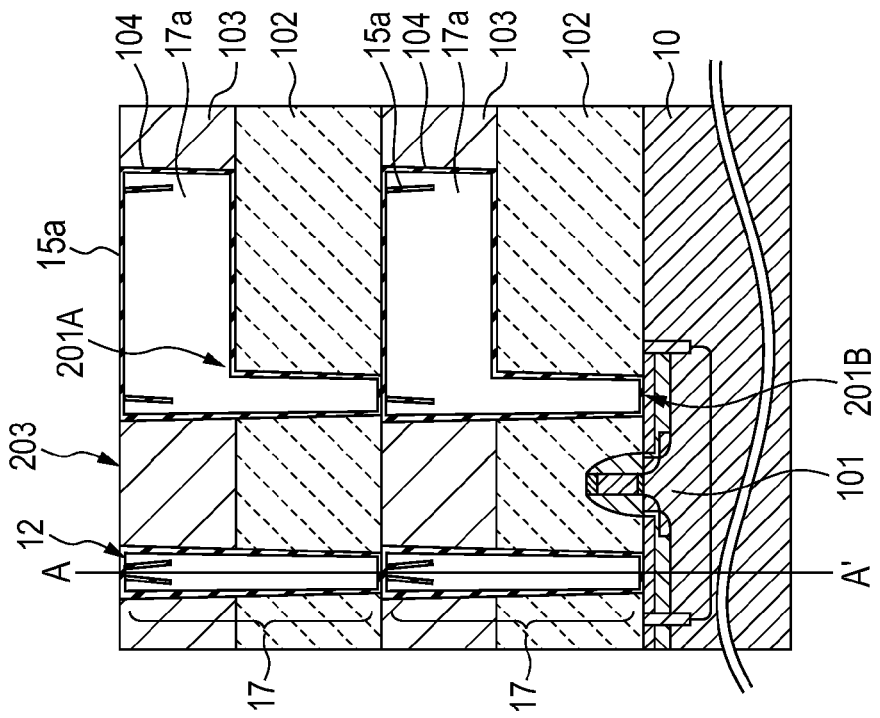

SEMICONDUCTOR DEVICE MANUFACTURING METHOD AND SEMICONDUCTOR DEVICE

CROSS-REFERENCES TO RELATED APPLICATIONS

The disclosure of Japanese Patent Application No. 2011-59216 filed on Mar. 17, 2011 including the specification, drawings and abstract is incorporated herein by reference in its entirety.

BACKGROUND

The present invention relates to a semiconductor device manufacturing method and a semiconductor device.

In recent years, as a method of forming a wiring structure of a semiconductor device, for example, a method described in Japanese Unexamined Patent Application Publication No. 2010-80525 and a method described in Jon Reid and Jian Zhou, "Electrofill Challenges and Directions for Future Device Generations", Advanced Metallization Conference 2007 Japan/Asia Session, pp. 26-27 are known.

Japanese Unexamined Patent Application Publication No. 2010-80525 describes a method including the steps of forming a Cu seed film over at least a bottom surface and a side wall of a concave portion of a wafer including a concave portion on the surface thereof, forming an Ru film or a TEOS film so that at least a portion of the Cu seed film located over the bottom surface of the concave portion is exposed and the Ru film or the TEOS film covers a portion of the Cu seed film located over the side wall of the concave portion, supplying electric current to the Cu seed film, forming a Cu plating film by an electroplating method so that the Cu plating film is deposited in the concave portion over which the Ru film is formed, performing a heat treatment on the Cu plating film, and then selectively removing the Ru film or the TEOS film. Japanese Unexamined Patent Application Publication No. 2010-80525 describes that the method can prevent the plating from growing from the side wall of the concave portion and reduce generation of voids.

Jon Reid and Jian Zhou, "Electrofill Challenges and Directions for Future Device Generations", Advanced Metallization Conference 2007 Japan/Asia Session, pp. 26-27 describes a technique for filling a trench of high aspect ratio with Cu by using a film formation accelerator and a macromolecular film formation retardant.

SUMMARY

However, the technique described in Jon Reid and Jian Zhou, "Electrofill Challenges and Directions for Future Device Generations", Advanced Metallization Conference 2007 Japan/Asia Session, pp. 26-27 requires a process for the side reaction of the film formation accelerator and the film formation retardant, so that the technique is not suited to industrial manufacturing. Further, when the miniaturization of semiconductor device advances and the opening size of the trench becomes small, the opening closes before Cu is deposited over the bottom surface of the trench, so that voids are generated.

Furthermore, the technique described in Japanese Unexamined Patent Application Publication No. 2010-80525 forms a plating blocking film such as the Ru film or the TEOS film over the entire side wall of the opening portion (concave portion) and the seed film is exposed over the bottom surface of the opening and the field portion outside the opening portion. Therefore, the film formation speed of the plating film over the bottom surface of the opening portion is the same as that of the plating film over the field portion. However, the plating film over the field portion proceeds isotropically, so that the plating film grows to approach the opening portion. Therefore, when the aspect ratio of the opening portion is high, the plating that grows from the field portion reaches the opening portion and closes the upper end of the opening portion before the plating that grows from the bottom surface reaches the upper end of the opening portion, so that it is not possible to prevent voids from occurring.

Therefore, a technique for forming fine wiring, which can reliably prevent voids from occurring, is still desired.

According to one aspect of the present invention, there is provided a semiconductor device manufacturing method including forming a seed film including a first metal over a bottom surface and a side wall of an opening portion formed over an insulating film and the insulating film except for the opening portion, forming a mask film over the seed film and filling the opening portion with the mask film, removing a part of the mask film while leaving the mask film over the seed film formed over the bottom surface of the opening portion and exposing the seed film, which is formed over an upper portion of the side wall of the opening portion and the insulating film except for the opening portion, forming a cover film including a second metal whose resistivity is higher than that of the first metal over the seed film located over the upper portion of the side wall of the opening portion and the insulating film except for the opening portion, exposing the seed film by removing the mask film left over the opening portion after forming the cover film, and forming a plating film including the first metal over the exposed seed film.

According to another aspect of the present invention, there is provided a semiconductor device including an opening portion formed over an insulating film, and built-in wiring including a wiring film which has a first metal as a principal component and is deposited into the opening portion, wherein the wiring film further includes a second metal whose resistivity is higher than that of the first metal, and a density of the second metal in the wiring film in an upper portion of the opening portion is higher than a density of the second metal in the wiring film in a lower portion of the opening portion.

According to the aspect of the present invention, the cover film is formed over the upper portion of the side wall of the opening portion and the insulating film except for the opening portion (field portion) by forming the seed film, and thereafter, filling the opening portion with the mask film before forming the plating film, and then, selectively removing the mask film. Thereby, it is possible to prevent the plating over the side wall of the opening portion and the field portion from growing and cause the plating inside the opening portion to grow to reach the upper end of the opening portion before the plating grows from the field portion to reach the opening portion. Therefore, it is possible to form a fine built-in wiring by filling up the opening portion without generating voids.

According to the aspects of the present invention, it is possible to prevent voids from occurring even in fine wiring, so that a highly reliable semiconductor device can be provided.

BRIEF DESCRIPTION OF THE DRAWINGS

FIG. 1A is a cross-sectional view schematically showing a manufacturing method according to a first embodiment and FIG. 1B is a cross-sectional view taken along line A-A' in FIG. 1A;

FIG. 2A is a cross-sectional view schematically showing a manufacturing method according to the first embodiment and FIG. 2B is a cross-sectional view taken along line A-A' in FIG. 2A;

FIG. 3A is a cross-sectional view schematically showing a manufacturing method according to the first embodiment and FIG. 3B is a cross-sectional view taken along line A-A' in FIG. 3A;

FIG. 4A is a cross-sectional view schematically showing a manufacturing method according to the first embodiment and FIG. 4B is a cross-sectional view taken along line A-A' in FIG. 4A;

FIG. 5A is a cross-sectional view schematically showing a manufacturing method according to the first embodiment and FIG. 5B is a cross-sectional view taken along line A-A' in FIG. 5A;

FIG. 6A is a cross-sectional view schematically showing a manufacturing method according to the first embodiment and FIG. 6B is a cross-sectional view taken along line A-A' in FIG. 6A;

FIG. 7A is a cross-sectional view schematically showing a manufacturing method according to the first embodiment and FIG. 7B is a cross-sectional view taken along line A-A' in FIG. 7A;

FIG. 8A is a cross-sectional view schematically showing a manufacturing method according to the first embodiment and FIG. 8B is a cross-sectional view taken along line A-A' in FIG. 8A;

FIG. 9A is a cross-sectional view schematically showing a manufacturing method according to the first embodiment and FIG. 9B is a cross-sectional view taken along line A-A' in FIG. 9A;

FIG. 10A is a cross-sectional view schematically showing a manufacturing method according to the first embodiment and FIG. 10B is a cross-sectional view taken along line A-A' in FIG. 10A;

FIG. 11A is a cross-sectional view schematically showing a manufacturing method according to the first embodiment and FIG. 11B is a cross-sectional view taken along line A-A' in FIG. 11A;

FIG. 12A is a cross-sectional view schematically showing a manufacturing method according to a second embodiment and FIG. 12B is a cross-sectional view taken along line A-A' in FIG. 12A;

FIG. 13A is a cross-sectional view schematically showing a manufacturing method according to the second embodiment and FIG. 13B is a cross-sectional view taken along line A-A' in FIG. 13A;

FIG. 14A is a cross-sectional view schematically showing a manufacturing method according to the second embodiment and FIG. 14B is a cross-sectional view taken along line A-A' in FIG. 14A;

FIG. 15A is a cross-sectional view schematically showing a manufacturing method according to the second embodiment and FIG. 15B is a cross-sectional view taken along line A-A' in FIG. 15A;

FIG. 16A is a cross-sectional view schematically showing a manufacturing method according to the second embodiment and FIG. 16B is a cross-sectional view taken along line A-A' in FIG. 16A;

FIG. 17A is a cross-sectional view schematically showing a manufacturing method according to the second embodiment and FIG. 17B is a cross-sectional view taken along line A-A' in FIG. 17A;

FIG. 18A is a cross-sectional view schematically showing a manufacturing method according to the second embodiment and FIG. 18B is a cross-sectional view taken along line A-A' in FIG. 18A.

FIG. 19A is a cross-sectional view schematically showing a manufacturing method according to the second embodiment and FIG. 19B is a cross-sectional view taken along line A-A' in FIG. 19A;

FIGS. 20A and 20B are diagrams for explaining a related technique; and

FIGS. 21A and 21B are cross-sectional views schematically showing a semiconductor device according to an embodiment and FIG. 21B is a cross-sectional view taken along line A-A' in FIG. 21A.

DETAILED DESCRIPTION

Hereinafter, embodiments of the present invention will be described with reference to the drawings. In all the drawings, the same constituent elements are denoted by the same reference numerals and the description thereof will be appropriately omitted.

First Embodiment

FIGS. 1 to 11 are diagrams for explaining a manufacturing method of a semiconductor device of a first embodiment. Among FIGS. 1A-11A and FIGS. 1B-11B, FIGS. 1A-11A are cross-sectional views and FIGS. 1B-11B are cross-sectional views taken along line A-A' in FIGS. 1A-11A, respectively.

The manufacturing method of the present embodiment includes a process of forming a seed film 13 including a first metal $M_1$ over bottom surfaces 201A and 201B and a side wall 202 of an opening portion 12 formed over interlayer insulating films 102 and 103 and a field portion 203 located over the interlayer insulating film 103 except for the opening portion 12 (FIG. 1), a process of forming a resist 14 (mask film) over the seed film 13 and filling the opening portion 12 with the resist 14 (FIG. 2), a process of removing a part of the resist 14 while leaving the resist 14 over the seed film 13 formed over the bottom surfaces 201A and 201B of the opening portion 12 and exposing the seed film 13 formed over the upper portion of the side wall 202 of the opening portion 12 and the field portion 203 (FIG. 3), a process of forming a cover film 15 including a second metal $M_2$, whose resistivity is higher than that of the first metal $M_1$, over the seed film 13 located over the upper portion of the side wall 202 of the opening portion 12 and the field portion 203 (FIG. 4), a process of exposing the seed film 13 by removing the resist 14 after forming the cover film 15 (FIG. 5), and a process of forming a plating film 16 including the first metal $M_1$ over the exposed seed film 13 (FIGS. 6 to 8).

Hereinafter, the semiconductor device manufacturing method of the present embodiment will be specifically described. In this specification, for convenience of description, the direction from the interlayer insulating films 102 and 103 to a semiconductor substrate 10 is defined as the downward direction and the direction from the semiconductor substrate 10 to the interlayer insulating films 102 and 103 is defined as the upward direction. For example, a silicon substrate is used as the semiconductor substrate 10, and semiconductor elements and the like such as a MOS transistor 101 are formed. Next, the interlayer insulating film 102 (first insulating film) and the interlayer insulating film 103 (second insulating film) 103 are laminated in this order by, for example, a chemical vapor deposition method (CVD method) or a coating method. The interlayer insulating films 102 and 103 may be, for example, a low dielectric constant film such as a silicon oxide film. Each of the interlayer insulating films 102 and 103 may be a single layer or multiple layers.

Next, the opening portion 12 is formed by using a photolithography technique and an RIE (Reactive Ion Etching) method. Specifically, a resist pattern is formed over the interlayer insulating film 103, the interlayer insulating films 102 and 103 are etched by the RIE method, and the opening portion 12 is formed so that the opening portion 12 penetrates the interlayer insulating films 102 and 103. Thereby, a wiring groove 12A is formed over the interlayer insulating film 103 and a via portion 12B coupled to the wiring groove 12A is formed over the interlayer insulating film 102. The via portion 12B is coupled to the MOS transistor 101. Thereafter, the resist pattern is removed by ashing or the like.

Here, the aspect ratio of the via portion 12B is preferred to be 3 or less. The via portion 12B is preferred to have a tapered shape. Thereby, it is possible to more reliably prevent a void from occurring in the via portion 12B.

Thereafter, a barrier metal film 104 is formed over the bottom surfaces 201A and 201B and the side walls 202A and 202B of the opening portion 12 by, for example, a sputtering method or the CVD method. For example, the barrier metal film 104 can be formed using a metal material used in the semiconductor. For example, the barrier metal film 104 can be a metal film including Ta, TaN, Ti, Ru, Ir, W, or a combination of these, or can be a laminated film of the metal films. The thickness of the barrier metal film 104 can be, for example, 1 to 20 nm.

Next, a seed film 13 is formed over the barrier metal film 104 by, for example, the sputtering method or the CVD method. The seed film 13 is formed over the bottom surfaces 201A and 201B and the side walls 202A and 202B of the opening portion 12 and the field portion 203. Although the first metal $M_1$ included in the seed film 13 may be, for example, Cu, Al, Sn, Zn, and/or Ti, Cu is preferred to be an indispensable component, and further Cu is more preferred to be a principal component. The seed film 13 may be formed of an alloy of Cu and other metals (Al, Sn, Zn, Ti, and the like). The thickness of the seed film 13 can be, for example, 10 to 100 nm. (FIG. 1)

Thereafter, the resist 14 is coated and the opening portion 12 is filled with the resist 14 (FIG. 2). In the present embodiment, the entire wiring groove 12A and the entire via portion 12B are filled with the resist 14. When the height of the deposited resist varies or unevenness occurs between the field portion 203 and the opening portion 12 depending on the size of the opening portion 12, the resist 14 may be coated twice or the resist 14 may be etched back and deposited again. Although the resist 14 is used here, other materials, which can realize a uniform height of the deposited resist, may be used. The opening portion 12 may be filled with the resist 14 by using a method other than the coating method.

Next, the resist 14 is selectively etched back using a plasma that uses gas including oxygen, a part of the seed film 13 formed over the field portion 203 and the side wall 202A of the wiring groove 12A is exposed, and the resist 14 is left inside the wiring groove 12A. In other words, the seed film 13 formed over the upper portion of the side wall 202A of the wiring groove 12A is exposed and the resist 14 is left inside the wiring groove 12A (FIG. 3). In the present embodiment, the seed film 13 formed over the lower portion of the side wall 202A of the wiring groove 12A and the side wall 202B of the via portion 12B is not exposed. Specifically, the seed film 13 located in a range of 10 to 50% of the entire depth of the wiring groove 12A may be exposed. Although the plasma that uses gas including oxygen is used here, the plasma can be arbitrarily changed according to the material deposited in the opening portion 12 and it is not necessary to use gas and plasma.

Next, a second metal $M_2$ is deposited over a portion where the seed film 13 is exposed by electroplating or the like and the cover film 15 is selectively formed (FIG. 4). The second metal $M_2$ is a metal different from the first metal $M_1$ and has a resistivity higher than that of the first metal $M_1$. The second metal $M_2$ is preferred to be oxidized easier than the first metal $M_1$ and be able to diffuse the seed film 13 and the plating film 16 by a heat treatment of 100 to 400° C. For example, Ni, W, Ru, Ti, Mn, Al, Sn, and the like can be used as the second metal $M_2$. When the first metal $M_1$ is Cu, the second metal $M_2$ is preferred to be Ni. The cover film 15 may be an alloy including these metals so that the cover film 15 has a resistivity higher than that of the seed film 13 and the cover film 15 is oxidized easier than the seed film 13. The second metal $M_2$ may be selectively deposited by another method such as electroless plating and CVD. The film thickness of the cover film 15 may be 0.5 to 1 atomic layer or more over the upper portion of the side wall 202A of the wiring groove 12A and the field portion 203.

Next, the resist 14 is removed by organic separation or plasma processing and the seed film 13 formed over the lower portion of the side wall 202A and the bottom surface 201A of the wiring groove 12A and the bottom surface 201B and the side wall 202B of the via portion 12B is exposed (FIG. 5). The resist 14 can be selectively removed without depending on the wiring width because the etching back of the resist 14 is not so much affected by the wiring width. If an altered layer is formed over the seed film 13 after the resist 14 is removed, the surface of the seed film 13 is cleaned, and thereafter the surface of the seed film 13 may be processed by, for example, oxalic acid or diluted fluoric acid, or commercially available cleaning fluid. The damage of the surface of the seed film 13 may be recovered by selectively causing the first metal $M_1$ to grow over the surface of the seed film 13 by electroless plating or the like.

Thereafter, an electric current is supplied to the seed film 13, the plating film 16 is formed by an electroplating method, and the opening portion 12 is filled with the plating film 16. The plating film 16 is preferred to include Cu as the first metal $M_1$, and further the plating film 16 is more preferred to include Cu as the principal component. The plating solution used to form the plating film 16 may be, for example, a solution in which a film formation accelerator or a film formation retardant can be added to a copper sulfate solution. For example, sodium sulfonate salt can be used as the film formation accelerator. For example, copolymer of polyethylene glycol and polypropylene glycol can be used as the film formation retardant.

The cover film 15 includes the second metal $M_2$ whose resistivity is higher than that of the first metal $M_1$, so that the resistivity of the cover film 15 is higher than that of the seed film 13. The surface potential is different between the cover film 15 and the seed film 13 and a current density of the cover film 15 is lower than that of the seed film 13. The cover film 15 is oxidized easier than the seed film 13, so that it is possible to prevent ions of the first metal $M_1$ in the plating solution from exchanging charges and being deposited as atoms of the first metal $M_1$ by a potential barrier of a natural oxide film formed over the cover film 15. In addition, the neutral atoms of the first metal $M_1$, which exchange charges, are difficult to be absorbed to the surface, so the atoms migrate and deposit over a portion where the seed film 13 is exposed. Further, the first metal $M_1$ in an atomic state is dissolved in a plating solution by Ostwald corrosion unless the first metal $M_1$ has a certain volume or more. The plating is prevented from growing over the cover film 15 because of the above reason, so that the plating film 16 is hardly formed. Because of the effect of the cover film 15, the plating film 16 grows only from the bottom surface 201A of the wiring groove 12A, the side wall 202A near the bottom surface 201A, and the via portion 12B. Therefore, immediately after the start of the plating, the plating grows over the via portion 12B in a usual manner, and at the same time, some plating is formed over the bottom surface 201A and the side wall 202A of the wiring groove 12A (FIG. 6).

When the via portion 12B is filled up, the plating film 16 grows from the bottom surface 201A of the wiring groove 12A to the upper end of the wiring groove 12A (FIG. 7).

Although, normally, even when the wiring groove 12A has been filled, the plating film 16 is hardly formed over the field portion 203 (FIG. 8), it is possible to substantially prevent the plating film 16 from being formed over the field portion 203 by optimizing the upper limit of the current density of the second metal $M_2$ and the plating. For example, the current density of the plating can be about 0.1 to 10 A/dm$^2$. By surely preventing the plating film 16 from growing from the field portion 203, it is possible to prevent the plating over the field 203 from growing to reach the opening portion 12 before the wiring groove 12A is filled up. The value of the current applied to the seed film 13 may be a product of the current density, an area of the semiconductor substrate 10, and an open area ratio of the opening portion 12.

Next, a first heat treatment (annealing) is performed on the plating film 16 and the like to grow crystals of the seed film 13 and the plating film 16. The condition of the heat treatment may be, for example, 100 to 400° C. and 5 minutes to 1 hour. Thereby, the seed film 13 and the plating film 16 become an integrated film, so that, hereinafter, the integrated film is referred to as a wiring film 17a. In the first heat treatment, the cover film 15 diffuses in the seed film 13 and the plating film 16 and the cover film 15 is mainly segregated and deposited near the surface of the plating film 16 (FIG. 9). Although, in FIG. 9, an example is shown in which the shape of the cover film 15 remains and the cover film 15 can be detected as the metal film 15a in the wiring film 17a, a high density area of the second metal $M_2$ may be provided in an area indicating the metal film 15a in FIG. 9. Even after the heat treatment, the density of the second metal $M_2$ near the area where the cover film 15 is formed is relatively high. Although the density of the second metal $M_2$ varies depending on a position even in the metal film 15a shown in the drawings and the high density area of the second metal $M_2$, the metal film 15a and the high density area of the second metal $M_2$ may be an area in which the density of the second metal $M_2$ is higher than that in the other areas in the wiring film 17a by a certain level. The heat treatment can be applied until the second metal $M_2$ is diffused so that the density of the second metal is uniform.

Thereafter, the seed film 13 and the cover film 15 over the field portion 203 are removed by chemical mechanical polishing (CMP) (FIG. 10). In the present embodiment, the plating film 16 is prevented from being formed over the field portion 203, so that the time taken for the CMP process can be shortened. Further, the manufacturing cost can be reduced by reducing the use amount of polishing agent. Furthermore, if the first heat treatment is performed so that the cover film 15 remains near the upper end of the wiring groove 12A, the cover film 15 formed over the upper portion of the side wall of the opening portion 12 can be completely removed by the CMP process.

By further performing a second heat treatment, built-in wiring 17 having a dual damascene structure including the first metal $M_1$ such as copper as a principal component is formed. In the built-in wiring 17, a state in which the density of the second metal $M_2$ is high is formed on the surface of the wiring film 17a, the area where the cover film 15 was formed, and areas near the surface of the wiring film 17a and the area where the cover film 15 was formed (FIG. 11). Although the cover film 15 may increase wiring resistance, if the heat treatment is performed so that the metal film 15a slightly remains near the surface as shown in FIG. 11, the wiring resistance is not affected. By optimizing the metal material forming the cover film 15 and optimizing the conditions of the first and the second heat treatments, the cover film 15 and the high density area of the second metal $M_2$ in the wiring groove 12A substantially disappear, and the high density area can be formed only on the surface of the built-in wiring 17.

The first and the second heat treatments can also be performed in an atmosphere including oxygen and water. Thereby, oxide can be formed over the surface of the first metal $M_1$, so that it is possible to expedite the diffusion of the second metal $M_2$ into the wiring film 17a. Further, when the first metal $M_1$ is Cu and the second metal $M_2$ is Ti, the first and the second heat treatments may be performed in an atmosphere including ammonia and nitrogen. Thereby, it is possible to not only expedite the diffusion of the second metal $M_2$, but also segregate and deposit TiN on the surface of the Cu, so that reliability can be improved. During heat treatment, plasma of these atmospheres may be irradiated to the surface of the wiring film 17a.

Thereafter, the semiconductor device is completed through an arbitrary process. As shown in FIG. 21, a metal wiring of a single damascene structure or a metal wiring of a dual damascene structure may be formed by further forming a multi-layer insulating film over the interlayer insulating film 103 and repeating the method described above.

As shown in FIG. 11, the semiconductor device obtained in the manner as described above includes the opening portion 12 formed over the interlayer insulating films 102 and 103 and the built-in wiring 17 that includes the first metal $M_1$ such as, for example, Cu as a principal component and has the wiring film 17a filling the opening portion 12. The wiring film 17a further includes the second metal $M_2$ whose resistivity is higher than that of the first metal $M_1$. The density of the second metal $M_2$ in the wiring film 17a in the upper portion of the opening portion 12 is higher than that of the second metal $M_2$ in the wiring film 17a in the lower portion of the opening portion 12. Specifically, the density of the second metal $M_2$ in the wiring film 17a located between the opening surface and the center of the depth of the opening portion 12 is higher than the density of the second metal $M_2$ in the wiring film 17a located between the center of the depth and the bottom surface. The density of the second metal $M_2$ may be uniform or non-uniform in a surface direction. When the density is non-uniform, as viewed from above, the density of the second metal $M_2$ in the wiring film 17a located in a predetermined range from the circumference and the center of the opening portion 12 is higher than the density of the second metal $M_2$ in the wiring film 17a located at the circumference or the center of the opening portion 12.

In the example shown in FIG. 11, the built-in wiring 17 is coupled to the MOS transistor 101. The metal film 15a including the second metal $M_2$ is formed in the wiring film 17a in the upper portion of the opening portion 12. The portion indicated by the metal film 15a may be an area including the second metal $M_2$ whose density is higher than that of the second metal $M_2$ included in the wiring film 17a located in the lower portion of the opening portion 12.

As described above, a multi-layer insulating film, in which the interlayer insulating film 102 and the interlayer insulating film 103 are laminated in this order, is formed, and the opening portion 12 is formed to penetrate the interlayer insulating film 102 and the interlayer insulating film 103. The density of the second metal $M_2$ in the interlayer insulating film 103 is higher than the density of the second metal $M_2$ in the interlayer insulating film 102.

The built-in wiring 17 includes the wiring groove 12A and the via portion 12B coupled to the wiring groove 12A as the opening portion 12 and has a dual damascene structure in which the wiring groove 12A and the via portion 12B are filled with the wiring film 17a. The density of the second metal $M_2$ in the wiring groove 12A is higher than the density of the second metal $M_2$ in the via portion 12B.

According to the semiconductor device as described above, a highly reliable semiconductor device can be formed because the opening portion 12 is filled without voids.

Next, the effects of the present embodiment will be described. According to the technique of the present embodiment, the cover film is formed from the side wall of the opening portion 12 to the field portion by forming the seed film 13, and thereafter, filling the opening portion 12 with the resist 14 before forming the plating film 16, and then, selectively removing the resist 14. Thereby, it is possible to prevent the plating over the side wall 202 of the opening portion 12 and the field portion 203 from growing and cause the plating inside the opening portion 12 to grow to reach the upper end of the opening portion 12 before the plating grows from the field portion 203 to reach the opening portion 12. Therefore, it is possible to form a fine built-in wiring 17 by filling up the opening portion 12 without generating voids.

Here, a related technique will be described. In semiconductor devices of recent years, a delay of signal transmission in wiring determines the speed of the device operation. The delay constant in the wiring is represented by a product of wiring resistance and interwiring capacity, so that the wiring resistance is reduced to speed up the device operation by using Cu, whose specific resistance value is small, as wiring material.

Multi-layer wiring is generally formed by a damascene method. The damascene method is a technique for forming an opening portion by processing an insulating film such as an interlayer insulating film, depositing a barrier metal and a seed film sequentially, and then, filling the opening portion by depositing a wiring metal in which the seed film is used as a cathode electrode of electroplating, removing the barrier metal and the wiring metal deposited over portions other than the opening portion by CMP, and depositing a barrier insulating film.

If a hole called a void is present in the wiring, electrical characteristics such as resistance, reliability, and yield ratio degrade, so that it is important that the opening portion is filled without voids. Therefore, a film formation accelerator and a film formation retardant are added to a plating solution, for example, a Cu plating solution, in addition to copper sulfate, so that the film formation speed over the bottom surface of the opening portion is faster than that over the side wall of the opening portion. This is called bottom-up filling or super conformal filling.

Although the details of mechanism of bottom-up film formation are unknown so far, the mechanism is generally described as follows. When the seed is dipped in the plating solution, the seed uniformly covers the inside and outside of the opening portion according to the densities of the film formation retardant and the film formation accelerator in the plating solution. Thereby, in an initial stage of plating film formation, the film grows conformally and the film is formed over the inside and outside of the opening portion at the same film formation speed. However, absorbed film formation accelerator is not desorbed, so that, when the plating grows, the density of the film formation accelerator increases over the bottom surface of the opening portion, and the film formation speed over the bottom surface increases. In the bottom-up film formation, if the plating film formation over the bottom surface of the opening portion is sufficiently faster than that over the upper end and the side surface of the opening portion, the growth surface reaches the opening front from the bottom surface before the wiring metal deposition closes, so that the opening portion can be filled without voids.

However, when the miniaturization of wiring advances and the opening size of the opening portion becomes small, bottom-up film formation is not performed in a usual plating solution. This is because the upper end of the opening portion closes before the density of the film formation accelerator becomes sufficiently high over the bottom surface due to the small size of the opening portion.

As a countermeasure against the above problem, Jon Reid and Jian Zhou, "Electrofill Challenges and Directions for Future Device Generations", Advanced Metallization Conference 2007 Japan/Asia Session, pp. 26-27 discloses a method for increasing densities of Cu and sulfuric acid in the plating solution and polymerizing film formation retardant and polyvinylpyrrolidone (PVP). Jon Reid and Jian Zhou, "Electrofill Challenges and Directions for Future Device Generations", Advanced Metallization Conference 2007 Japan/Asia Session, pp. 26-27 describes that the film formation accelerator is activated by increasing the density of sulfuric acid and the deposition probability increases by increasing the density of Cu, so that bottom-up performance is improved. Further, Japanese Unexamined Patent Application Publication No. 2010-80525 also describes that the diffusion speed in the plating solution decreases by polymerizing PVP, the amount of absorption into the opening portion decreases in an initial stage of the plating film formation, and the ratio of the film formation accelerator increases in the opening portion, so that the bottom-up can be performed even when the size of the opening portion is further miniaturized.

However, according to the study of the inventors, increasing the density of Cu and sulfuric acid increases the risk of generating particles by deposition of copper sulfate and the failure of the device due to this. The film formation retardant and the PVP decompose during use, so that the effect cannot be obtained after a long time use. To prevent the above problem, the plating solution should be changed frequently. However, this causes increase in cost, so this method is not suited to industrial manufacturing. Further, the technique described in Jon Reid and Jian Zhou, "Electrofill Challenges and Directions for Future Device Generations", Advanced Metallization Conference 2007 Japan/Asia Session, pp. 26-27 only increases the effect of the film formation accelerator in the opening portion and the mechanism of bottom-up is the same, so that the bottom-up film formation is not performed when the size of the opening portion is further miniaturized.

As described in the method of Japanese Unexamined Patent Application Publication No. 2010-80525, when a plating blocking film 95 is formed only over a side wall 92c of an opening portion 92a, as shown in FIG. 20A, the plating grows from a bottom surface 92b of the opening portion 92a and a field portion 92d outside the opening portion 92a. As described above, when a seed film 93 covers the bottom surface 92b and the side wall 92c of the opening portion 92a, as the plating film 96 grows, the area of the bottom surface of the opening portion 92a over the plating film 96 decreases, a plating accelerator is concentrated, and the film forming speed over the bottom surface becomes faster than that over the side wall 92c and the field portion 92d. However, when the entire side wall 92c is covered with the plating blocking film 95, the film forming speed of the plating is maintained at the same film forming speed as that over the field portion 92d, so that the film formation of the plating film 96 over the field portion 92d proceeds isotropically and the plating film 96 approaches the upper end of the opening portion 92a. Therefore, when the opening portion 92a has a pattern of an aspect ratio of about 0.5 or more, as shown in FIG. 20B, the opening portion 92a closes due to the film formation from the field portion 92d before the bottom-up film formation reaches the upper end of the opening portion 92a. On the other hand, when the aspect ratio of the opening portion 92a is about 0.5 or less, the anisotropy of dry etching disappears, so that it is difficult to remove the plating blocking film 95 while leaving only the plating blocking film 95 of thickness of several nm over the side wall. Therefore, the plating blocking film 95 cannot be selectively formed only over the side wall 92c of the opening portion 92a.

On the other hand, in the present embodiment, the resist 14 is coated, and then the resist 14 is removed by etching back or the like so that the resist 14 covers only the bottom surfaces 201A and 201B, and the cover film 15, which prevents plating using the resist 14 as a mask, is selectively grown, so that the seed film 13 is exposed near the bottom surfaces 201A and 201B of the opening portion 12. Thereby, the cover film 15 can be formed over the field portion 203 and the side wall 202A except for portions near the bottom surfaces 201A and 201B of the opening portion 12 regardless of the wiring width. The cover film 15 deposited over the upper portion of the side wall 202 of the opening portion 12 includes the second metal $M_2$ whose resistivity is higher than that of the first metal $M_1$ in the seed film 13, so that the surface potential of the cover film 15 is different from that of the seed film 13. The cover film 15 is oxidized easier than the seed film 13. Therefore, the cover film 15 is configured so that the surface is naturally oxidized and a reduction reaction is difficult to proceed. The cover film 15 is configured to have a resistance higher than that of the seed film 13 even when the reduction reaction proceeds, so that it is possible to lower the current density of the cover film 15. Therefore, the plating film 16 is hardly formed over the upper portion of the side wall 202 of the opening portion 12 and the field portion 203, and the plating film 16 can be preferentially formed from the bottom surfaces 201A and 201B of the opening portion 12. Thereby, when the opening portion 12 has a high aspect ratio, the bottom-up film formation can be performed, so that the plating film can be grown from only near the bottom surfaces 201A and 201B of the opening portion 12 regardless of the aspect ratio. As described above, in the present embodiment, there is no film formation from the side wall 202 of the opening portion 12 and the field portion 203, so that the upper end of the opening portion 12 is not closed before the opening portion 12 is completely filled up. Therefore, it is possible to reduce the generation of voids.

Second Embodiment

FIGS. 12 to 19 are diagrams for explaining a manufacturing method of a semiconductor device of a second embodiment. Among FIGS. 12A-19A and FIGS. 12B-19B, FIGS. 12A-19A are cross-sectional views and FIGS. 12B-19B are cross-sectional views taken along line A-A' in FIGS. 12A-19A, respectively. In the present embodiment, only points different from the first embodiment will be described.

As described in the first embodiment, the barrier metal film 104 is formed over the opening portion 12 formed over the interlayer insulating films 102 and 103 over the semiconductor substrate 10, and thereafter, the seed film 13 including the first metal M1 is formed over the bottom surfaces 201A and 201B and the side wall 202 of the opening portion 12 and the field portion 203 which is the surface of the interlayer insulating film 103 except for the opening portion 12. At this time, different from the first embodiment, in the present embodiment, the via portion 12B is filled with the seed film 301 (FIG. 12).

Thereafter, in the same manner as in the first embodiment, the resist 14 is formed over the seed film 301 and the opening groove 12A is filled with the resist 14 (FIG. 13), and then, a part of the resist 14 is removed and the seed film 301 formed over the upper portion of the side wall 202A of the opening groove 12A and the field portion 203 is exposed (FIG. 14), and the cover film 15 is formed over a portion from the upper portion of the side wall 202A of the opening groove 12A to the field portion 203 where the seed film 301 is exposed (FIG. 15). Next, the resist 14 is removed and the seed film 301 is exposed (FIG. 16), the plating film 16 is formed over the exposed seed film 301 (FIGS. 17 and 18), and the opening portion 12 is filled up (FIG. 19). The process thereafter is the same as that described in the description of the first embodiment and FIGS. 9 to 11.

In the method of the present embodiment, the via portion 12B is substantially filled with the seed film 301, so that it is possible to reduce the risk of generating voids in the via portion 12B more reliably than in the first embodiment.

Although the embodiments of the present invention have been described with reference to the drawings, these are examples of the present invention, and various configurations other than the above can be employed. For example, although an example in which a structure where a transistor is formed in a semiconductor substrate is used as a substrate is described in the embodiments, it is possible to use a wiring layer formed on a transistor as a substrate instead of the semiconductor substrate.

What is claimed is:

1. A semiconductor device manufacturing method comprising:
    forming a seed film including a first metal over a bottom surface and a side wall of an opening portion formed over an insulating film and the insulating film outside of the opening portion;
    forming a mask film over the seed film and filling the opening portion with the mask film;
    removing a part of the mask film while leaving the mask film over the seed film formed over the bottom surface of the opening portion and exposing the seed film, which is formed over an upper portion of the side wall of the opening portion and the insulating film except for the opening portion;
    forming a cover film including a second metal whose resistivity is higher than that of the first metal over the seed film located over the upper portion of the side wall of the opening portion and the insulating film except for the opening portion;
    exposing the seed film by removing the mask film left over the opening portion after forming the cover film; and
    forming a plating film including the first metal over the exposed seed film.

2. The semiconductor device manufacturing method according to claim 1,
    wherein the insulating film is a multi-layer insulating film in which a first insulating film and a second insulating film are laminated in this order, wherein the opening portion is formed to penetrate the first insulating film and the second insulating film, and wherein, in the step of exposing the seed film, the seed film formed over the upper portion of the side wall inside the second insulating film is exposed and the mask film is left inside the second insulating film.

3. The semiconductor device manufacturing method according to claim 1, wherein, after the step of forming the plating film, the cover film and the seed film which are formed over the insulating film outside of the opening portion are removed.

4. The semiconductor device manufacturing method according to claim 1, further comprising:

performing a heat treatment on the plating film after the step of forming the plating film, wherein, in the step of performing the heat treatment on the plating film, the second metal is diffused into the plating film, and a buried wiring structure including the first metal as a principal component is formed.

5. The semiconductor device manufacturing method according to claim 4, wherein the buried wiring structure has a dual damascene structure.

6. The semiconductor device manufacturing method according to claim 1, wherein the opening portion includes a wiring groove and a via portion coupled to the wiring groove, and wherein, in the step of exposing the seed film, the seed film formed over the upper portion of the side wall of the wiring groove is exposed and the mask film is left inside the wiring groove.

7. The semiconductor device manufacturing method according to claim 6, wherein, in the step of filling the opening portion with the mask film, the via portion is filled with the mask film, and wherein, in the step of exposing the seed film, the seed film formed over the upper portion of the side wall of the wiring groove is exposed while the via portion is filled with the mask film.

8. The semiconductor device manufacturing method according to claim 6, wherein, in the step of forming the seed film, the via portion is filled with the seed film.

9. The semiconductor device manufacturing method according to claim 1, wherein the first metal is copper.

10. The semiconductor device manufacturing method according to claim 1, wherein the second metal is nickel.

* * * * *